United States Patent [19]

Heckaman et al.

[11] Patent Number: 5,014,114
[45] Date of Patent: May 7, 1991

[54] HIGH SPEED, HIGH DENSITY SEMICONDUCTOR MEMORY PACKAGE WITH CHIP LEVEL REPAIRABILITY

[75] Inventors: Douglas E. Heckaman, Indialantic; Roger H. Higman, Palm Bay, both of Fla.

[73] Assignee: Harris Corporation, Melbourne, Fla.

[21] Appl. No.: 251,886

[22] Filed: Sep. 30, 1988

[51] Int. Cl.⁵ ............... H01L 39/02; H01L 23/48; H01K 7/20
[52] U.S. Cl. ................................. 357/74; 361/392; 361/393
[58] Field of Search ............... 357/74; 361/392, 393

[56] References Cited

U.S. PATENT DOCUMENTS

| | | | |
|---|---|---|---|
| 4,489,364 | 12/1984 | Chance et al. | 361/395 |
| 4,509,096 | 4/1985 | Baldwin et al. | 357/81 |
| 4,549,200 | 10/1985 | Ecker et al. | 357/74 |
| 4,630,096 | 12/1986 | Drye et al. | 357/74 |
| 4,630,172 | 12/1986 | Stenerson et al. | 357/81 |
| 4,658,332 | 4/1987 | Baker et al. | 361/398 |
| 4,667,220 | 5/1987 | Lee et al. | 357/74 |
| 4,725,878 | 2/1988 | Miyauchi et al. | 357/74 |
| 4,744,007 | 5/1988 | Watari et al. | 357/81 |
| 4,744,009 | 5/1988 | Grabbe et al. | 361/394 |
| 4,760,335 | 7/1988 | Lindberg | 361/400 |
| 4,803,595 | 2/1989 | Kraus et al. | 361/416 |
| 4,811,082 | 3/1989 | Jacobs et al. | 357/80 |
| 4,827,327 | 5/1989 | Miyauchi et al. | 357/74 |
| 4,868,712 | 9/1989 | Woodman | 361/388 |
| 4,872,844 | 10/1989 | Grebe et al. | 439/69 |
| 4,878,846 | 11/1989 | Schroeder | 351/75 |
| 4,890,195 | 12/1989 | Heckaman et al. | 361/417 |

Primary Examiner—Andrew J. James
Assistant Examiner—Viet Q. Nguyen
Attorney, Agent, or Firm—Evenson, Wands, Edwards Lenahan & McKeown

[57] ABSTRACT

A packaging structure mounts integrated circuit chips in a nested, cavity-up configuration, so as to permit access to the modules for reworkability, but without the use of a separate printed circuit board for support and interconnect among the modules. Each monolithic integrated circuit module comprises a cavity-up leadless chip carrier which is affixed to its own dedicated thermally and electrically conductive mounting base, that effectively plugs into an underlying ground plane, heat sink support. The mounting base may comprise of a thin conductive plate having a cylindrical stem, through which the mounting base is retained within an aperture in the underlying support. The underlying support has a plurality of cylindrical stem engaging apertures distributed in a matrix configuration, so that the insertion of a plurality of chip carrier mounting bases into the apertures of the matrix causes the mounting bases to be aligned edgewise in a tight edge-to-edge array. Distributed along edge portions of a mounting base contact regions to which conductive traces from topside wirebond links on the chip extend. Interconnection between chip carriers may be accomplished by elastomeric connectors bridging the contact regions of the mutually aligned edges of the mounting bases. Circuit-to-circuit interconnections are accomplished through IC chip wiring layers or an additional wiring layer in the chip carrier.

30 Claims, 6 Drawing Sheets

HIGH SPEED, HIGH DENSITY SEMICONDUCTOR MEMORY PACKAGE WITH CHIP LEVEL REPAIRABILITY

FIELD OF THE INVENTION

The present invention relates in general to the packaging of monolithic integrated circuit components and is particularly directed to a scheme for packaging high speed, high density integrated circuit chips (e.g. GaAs memory chips) that allows individual components to be selectively replaced (repaired) without adversely affecting the reliability of the overall circuit structure within which the components are incorporated.

BACKGROUND OF THE INVENTION

Packaging arrangements for monolithic integrated circuit components (e.g. memory chips) typically involve the use of a support/interconnect structure in which one or more circuit modules (e.g. leadless chip carriers) are physically mounted on and have signal/power connections with electrical conductor traces of a printed circuit board. In a cavity-up mounting configuration electrical connections between the chip and the signal highways of the printed circuit board may take the form of wire bond links between pads distributed along the edge or perimeter of the chip and connection regions of the conductor traces of the printed circuit board. In a cavity-down mounting configuration contact pads on an inverted chip are bonded directly to connection regions on the printed circuit board. This latter mounting/interconnect scheme has the advantage of reducing the amount of space required for completing electrical connections between the chip and the printed circuit board and, consequently, offers an increase in circuit packing density compared with conventional cavity-up printed circuit board mounting schemes. However, it substantially impedes replacement and/or repairability of the chip, since the inverted mounting of the chip prevents direct access to the interconnect bonding points, an aspect of the former technique that is especially desireable where the reworkability of a portion of a modular system may be mandated by manufacturing cost constraints but limited to only non-microelectronic high reliability procedures, as required for critical spaceborne systems.

SUMMARY OF THE INVENTION

In accordance with the present invention there is provided a new and improved packaging structure for monolithic integrated circuit modules, particularly high speed, high density memory chips, through which a plurality of modules may be mounted in a nested, cavity-up configuration, so as to permit access to the modules for reworkability, but without the use of a separate printed circuit board for support and interconnect among the modules, whereby substantially enhanced packing density is afforded.

Pursuant to the improved packaging structure according to the present invention, each monolithic integrated circuit module comprises a cavity-up leadless chip carrier which is affixed to its own dedicated thermally and electrically conductive mounting base, that effectively plugs into an underlying ground plane, heat sink support. The mounting base is comprised of a thin, preferably conductive, flat plate having a thermally and electrically conductive cylindrical stem, which extends from the bottom surface of the plate and has an annular groove that is sized to engage a removable snap ring within a cylindrical aperture extending through the underlying support. Through engagement of the snap ring with the annular groove in the stem, the mounting base is captured by and retained within the underlying support. A conductive retention spring member is interposed between the thin plate and the support, so as to urge the thin plate away from the underlying support and impart shock-absorbing, structural rigidity to the mounting base.

To provide for compact nesting of the chip carrier mounting bases, the underlying support has a plurality of cylindrical stem engaging apertures distributed in a matrix configuration, such that the insertion of a plurality of chip carrier mounting bases into the apertures of the matrix causes the mounting bases to be aligned edgewise in a tight edge-to-edge array. To facilitate alignment of the chip carriers, the mounting bases have stems that are keyed for preoriented engagement with the apertures in the support. Preferably the top surface of an individual mounting base upon which a chip carrier is supported has a square configuration in plan, so as to maximize the areal nesting density of a plurality of chip carriers on the support member. Distributed along the upper edge portions of the mounting base on an insulating substrate are a plurality of contact regions to which conductive traces from topside wirebond links on the chip extend. With adjacent mounting bases that are retained in the underlying support member having their mutual edges aligned with each other, interconnection between chip carriers may be accomplished by minimal length conductive coupling elements such as replaceable/reworkable wire bonds or elastomer-captured conductive strips bridging the contact regions of the mutually aligned edges of the mounting bases. Chip-to-chip connections may be accomplished through integrated circuit wiring or through additional conductor paths in ceramic/dielectric supported/isolated layers underneath the integrated circuit chip. Such an interconnection scheme may be employed for D.C., strobe, clock signals, etc. These paths eliminate the typical printed wiring board conductors, such as those found in semiconductor memories.

As a result of this ability to compactly nest the mounting bases and the chip carriers thereon, so that they can be conductively bridged by a simplified, reduced length (low inductance) connector, the conventional need of a separate printed circuit board for support and interconnection of the chip carriers is obviated. In addition, the mechanical arrangement of the interconnecting elastomer-captured conductive strips and the ability to 'snap' each mounting base into and out of the apertures of the underlying support facilitates selective reworking of a multichip system, and thereby constitutes a significant cost reduction aspect of the invention.

DETAILED DESCRIPTION

Figure 1:
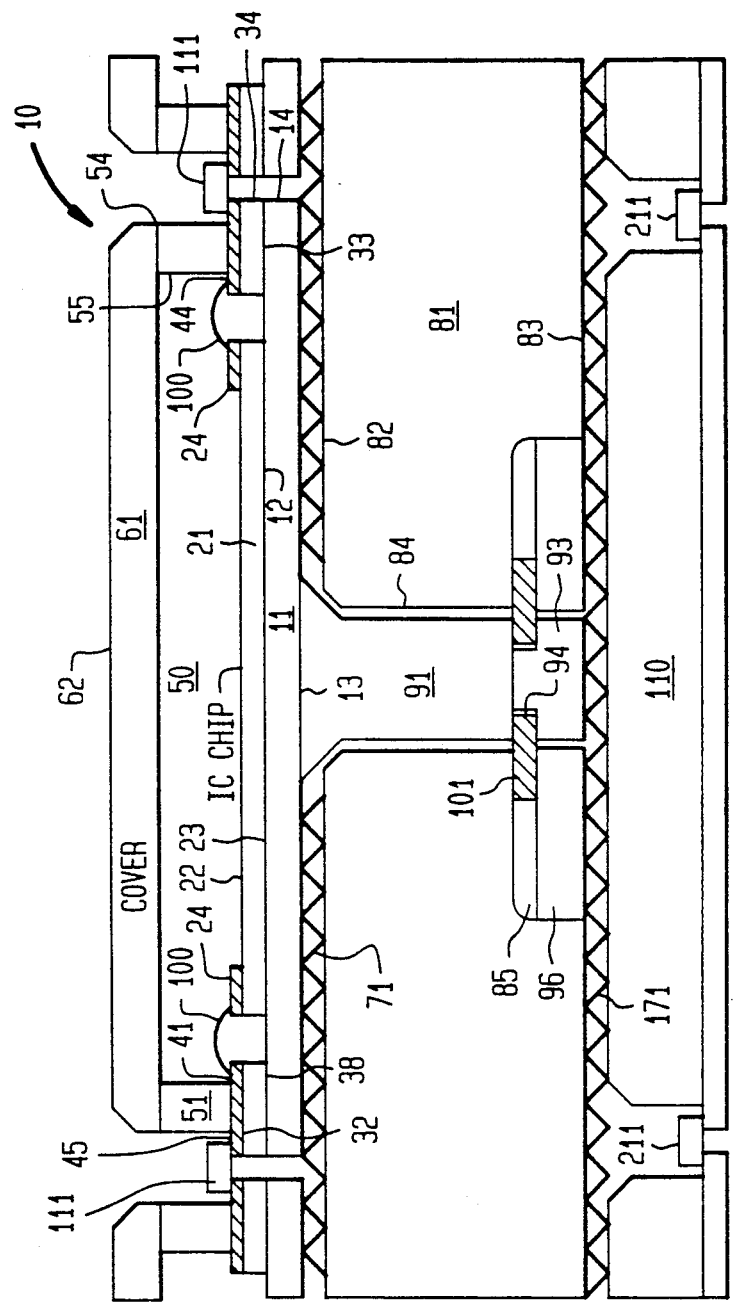
FIGS. 1 and 2 show respective diagrammatic side and top views of an embodiment of the chip carrier packaging scheme according to the present invention.
Figure 2:
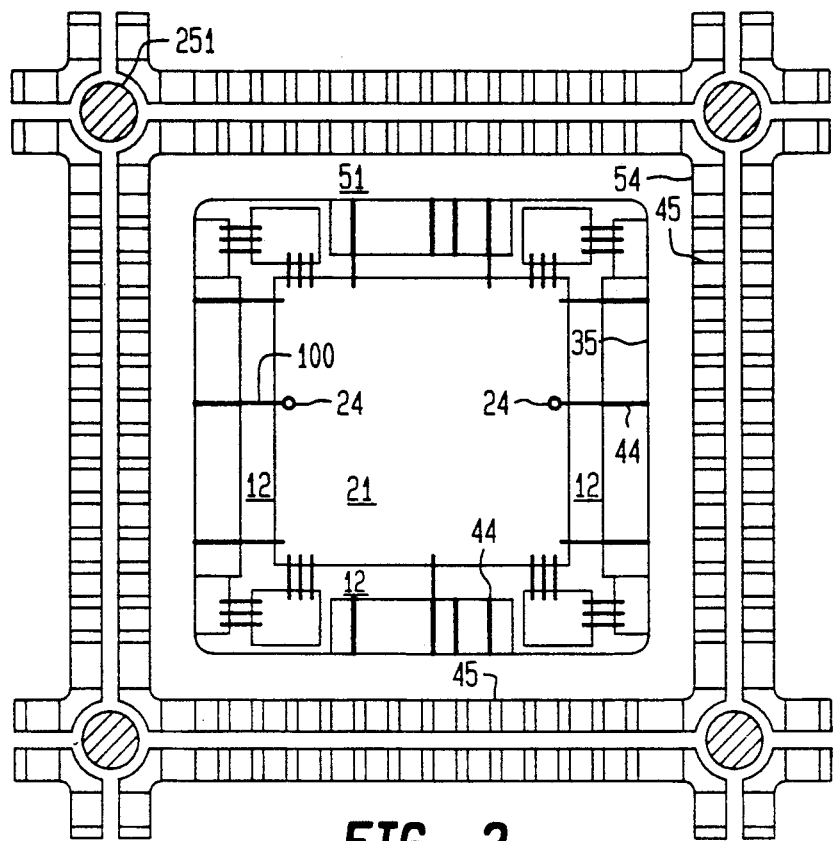

Referring now to FIGS. 1 and 2, there are shown respective diagrammatic side and top views of an embodiment of the chip carrier packaging scheme according to the present invention. As shown therein, a plurality of chip carriers 10, each having a generally rectangular or square perimeter outlined in plan, are arranged in side by side relationship, so as to form an array of chip carriers or integrated circuit chip-containing modules, supported by an underlying support plate member 81. It should be observed that the shape o outline of the perimeter of the modules, in plan, is not limited to the rectangular/square shape shown in FIG. 2, but may be any other shape, such as triangular, or hexagonal, for example, which permits the chip carriers to be arranged in side by side relationship with the sides thereof immediately adjacent to one another. Preferably, however, the rectangular/square configuration is employed, particularly in the case of memory chips, because of the parallelism aspects of the respective (orthogonally arranged) address and data lines, so that a two-dimensional array of memory chips, with respectively orthogonal sets of parallel address and data lines enables a large capacity memory to be formed from a plurality of lesser capacity chip-containing carriers.

Each chip carrier is preferably comprised of a support plate member 11 which may be either a metallic plate or a metallized ceramic plate having electrical and thermal conductive communications paths therethrough between its top surface 12 and bottom surface 13. In the configuration shown in FIG. 1, plate 11 is a metallic plate, such as a 0.020 inch thick plate of copper-tungsten alloy having an edge length on the order to approximately 500 mils. The use of a metallized ceramic plate for support plate member 11 will be described below with reference to FIG. 8.

Disposed at an interior portion of the top surface 12 of plate 11 is an integrated circuit chip 21, such as a semiconductor integrated circuit memory chip having a top surface 22 and a bottom surface 23. Chip 21 is bonded and ground plane-connected to the top surface 12 of carrier plate 11. Distributed along the edges of the memory chip 21 are a plurality of wire bonding pads 24 for providing top-side electrical connections between signal and power ports on the chip to conductive links of the carrier which surround the chip. These conductive links are preferably comprised of an arrangement of signal conductors 44 selectively formed on the top surface 32 of an insulating (ceramic) square-ring member 31 the bottom surface 33 of which is disposed on the top surface 12 of carrier plate 11, such that the side edges 34 are aligned with the side edges 14 of the carrier plate 11. Hermetically sealed (e.g. co-fired) to the signal conductor ceramic ring 31 of carrier 10 (the bottom of ring 31 is metallized and bonded to top surface 12) is a square ring-shaped wall 51 atop which a cover layer 61 is attached. The interior surface 55 of ceramic wall 51, the bottom surface 63 of cover 61 and the top surface 12 of carrier plate 11 define a chip-containing cavity 50 of the carrier 10.

Wire bond connections shown generally at 100 interconnect the contact pads 24 on the top surface 22 of the chip 21 and interior portions 44 of the signal conductors 41 which extend beyond the outer side 54 of the ceramic wall 51 of the chip carrier, to provide an array of spaced apart and preferably periodically distributed electrical contact regions 45.

For retaining a plurality of chip carriers 10, the underlying support plate 81 is provided with an array of cylindrical apertures 84 which extend from the top surface 82 of the support plate to its bottom surface 83. The apertures may be cylindrically contoured to receive a thermally and electrically conductive cylindrical stem 9 which extends from the bottom surface 13 of the carrier plate 11. Cylindrical stem 91 is preferably provided with an annular groove 94 which is adapted to engage a snap ring 101 retained in a wider diameter portion 85 of aperture 84 by a plug ring 96, inserted into the cylindrical aperture from the bottom side 83 of the support plate member 81.

Interposed between the bottom surface 13 of the carrier plate 11 and the top surface 82 of the support plate member 81 is a flexible, electrically and thermally conducting mesh spring member 71 which acts to urge the bottom surface 13 of carrier plate 11 away from the top surface 82 of support plate member 81 when the stem is engaged by the snap ring 101, so as to stabilize the carrier 10 when mounted to the support plate member 81.

Apertures 84 are preferably periodically distributed in a two-dimensional array through support plate member 81, so that the sides of the chip carriers 10 are disposed in substantially mutual abutting alignment with one another as shown in FIG. 2, with only a slight spacing between the sides of the chip carriers (on the order 0.010 inches). Electrical connections between the chip carriers is preferably accomplished by bridging the electrical contact regions 45 via direct wire bonding or with an elastomeric connector 111 containing a plurality of parallel conductors embedded in a flexible elastomer member, such as a parallel board-type elastomeric connector manufactured by PCK Elastomerics Inc., providing low inductance bridging of the electrical contact regions 45 of adjacent chip carriers.

The arrangement shown in FIGS. 1 and 2 differs significantly from conventional chip carrier support and interconnect structures in that no printed circuit board is employed for mounting and providing electrical interconnect between the contact regions of the respective carriers. Instead, an effectively direct electrical connection from carrier-to-carrier is accomplished through the elastomeric connectors 111 bridging contact regions 45 along the mutually aligned edges of adjacent carriers. The underlying support plate member 81 provides mechanical support and a ground plane/heat removal path for the components of the chip carrier/modules. Advantageously, and quite unlike conventional printed circuit board connection schemes, with the mechanism of the present invention, an individual chip carrier may be easily removed simply by removing the elastomer connectors 111 and then "popping out" the chip carrier of interest by forcing open the snap ring 101 and then pressing upon the stem 91 from its bottom side 93 through the aperture 84 from the bottom surface 83 of the support plate member 81. In effect, this means that a multichip system, such as a large capacity memory can be selectively reworked on a chip carrier-by-chip carrier basis.

Also shown in the diagrammatic side view of FIG. 1 is the manner in which a plurality of support plate members 81 and chip carriers contained thereon may be stacked in the vertical direction, so as to effectively form a three-dimensional packaging arrangement made of a laminate of two-dimensional arrays of chip carriers described above. To simplify the drawing, FIG. 1 shows an addition chip carrier 110 located vertically directly beneath chip carrier 10 with a flexible mesh spring member 171 interposed therebetween to provide electrical and thermal continuity between the conductive housings including the conductive cover and underlying support plate members.

FIG. 2 additionally shows a plurality of feed through capacitor connection pins 251 located at the corners of the respective chip carriers. These pin/capacitor connections serve to provide DC bypass capacitor elements at a plurality of locations throughout the memory packaging scheme, as required for operation of the memory (for avoiding unwanted chip enable inputs during switching transients).

Figure 3:
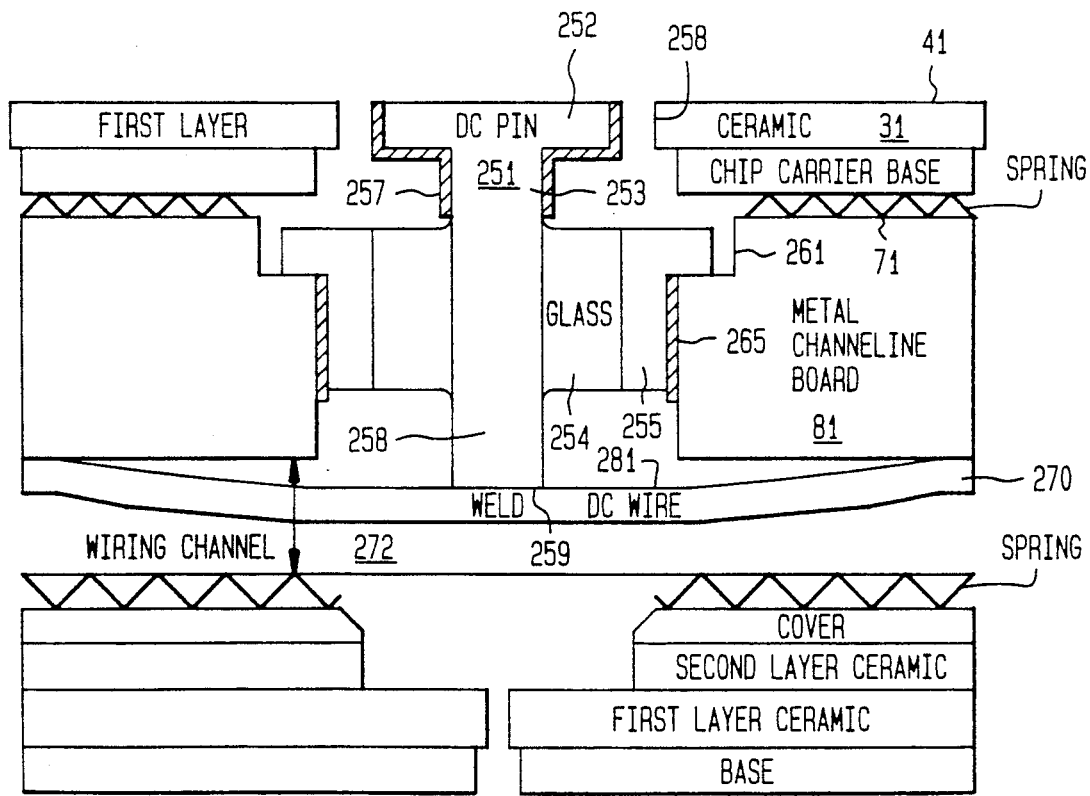
FIGS. 3 and 4 show respective enlarged diagrammatic side and top views of feed-through type bypass capacitor elements.
Figure 4:
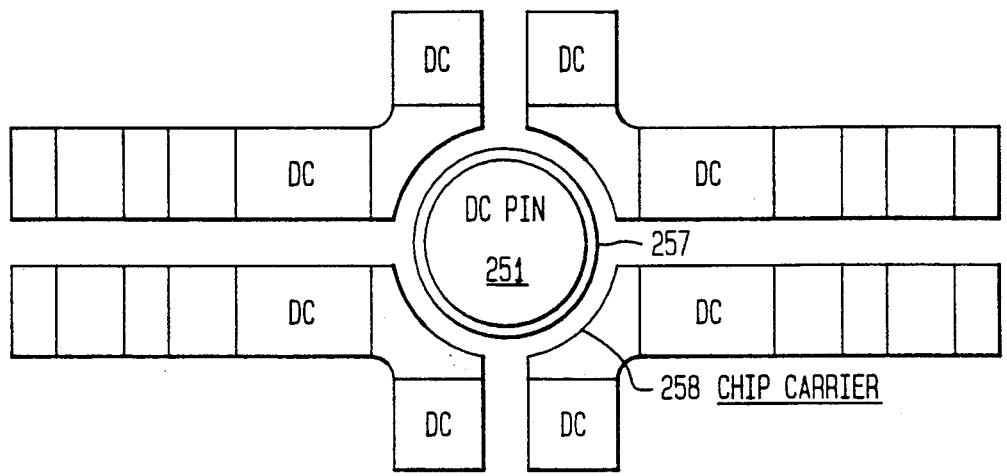

FIGS. 3 and 4 show respective enlarged diagrammatic side and top views of such bypass and feed through capacitor elements. As shown therein, an individual capacitor may comprise a conductive (e.g. gold-plated Kovar) pin 251 having a generally cylindrical or circular head portion 252 from which extends a reduced diameter shank portion 253, the pin being coaxial with a cylindrical aperture which extends through ceramic layer 31, the metal carrier plate 11 and the underlying support plate member 81, as shown. Pin 253 is supported within stepped aperture 261 by a surrounding glass bead layer 254 and a conductive ferrule 255 which is preferably bonded to aperture 261 in support plate 81 by a conductive layer 265, such as a tin-lead solder layer, therebetween. Glass or ceramic dielectric layer 254 may comprise a glass, such Corning 7074 glass, or a high k ceramic with a dielectric constant greater than 100. Preferably the upper shank portion 253 and sidewalls of head portion 252 of pin 251 are coated with an insulating film 257, such as a Teflon film. The lower extending portion 258 of the shank 253 is welded at a region 259 to a D.C. conductor 270 which extends through a wiring channel 272 channeled into the bottom surface of the support plate member 81. D.C. conductor 270 interconnects each of the pins 251 and the chip carrier array and provides a common D.C. connection point throughout the memory.

Figure 5:
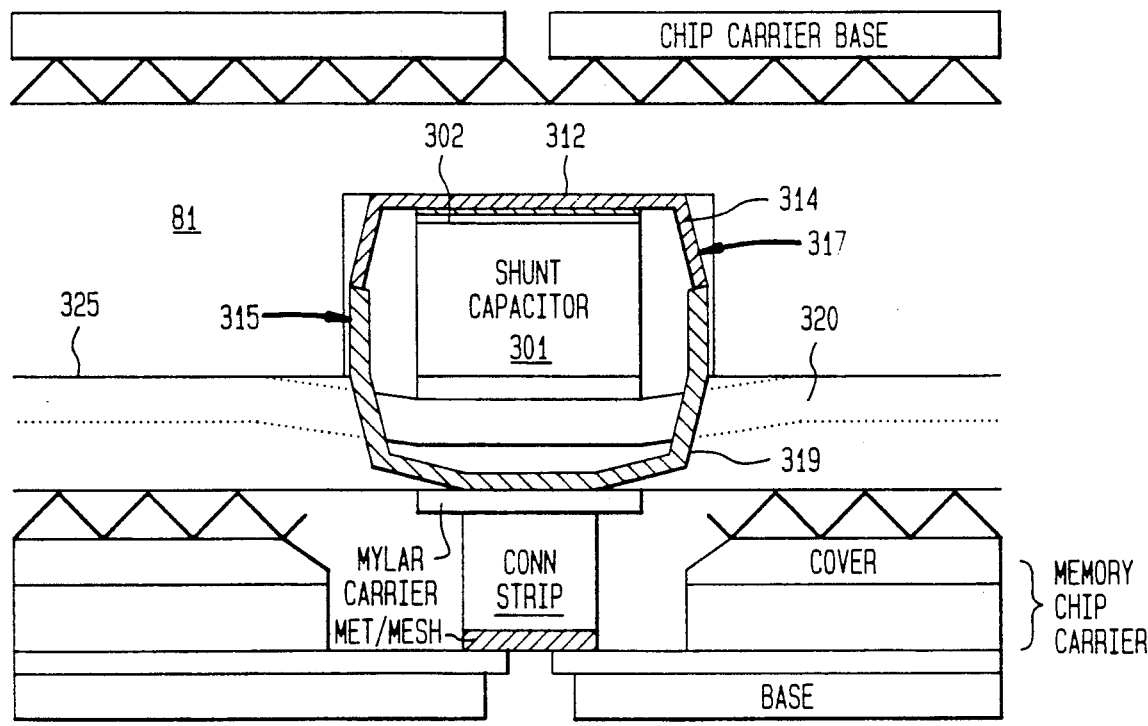
FIG. 5 shows a substantially rectangularly shaped shunt capacitor that may be captured in a cavity crossed by a wire channel and connected to a D.C. conductor line within a support plate.

The support plate member 81 may be provided with D.C. bypass capacitors other than the feed through pin/capacitor configurations shown in FIGS. 1-4. For example, as shown in FIG. 5, a substantially rectangularly shaped shunt capacitor 303, such as an 'A' case size element manufactured by American Technical Ceramics Corp., having upper and lower conductive layers 302 and 303, may be inserted and captured in a cylindrical cavity 312 by soldering the upper conductor-layer 302 to a generally rectangular-shaped leaf spring member 314 having tabs 317 which 'bite' the sidewalls of the cavity. Electrical grounding connection is through the spring into the conductive cavity walls. The lower conductive layer 303 is electrically bonded by welding or soldering, to a D.C. conductor line 320 located in a channel 325 within support plate 81. A protective dielectric cover or shroud 315 surrounds the capacitor to prevent shorts.

Figure 6:
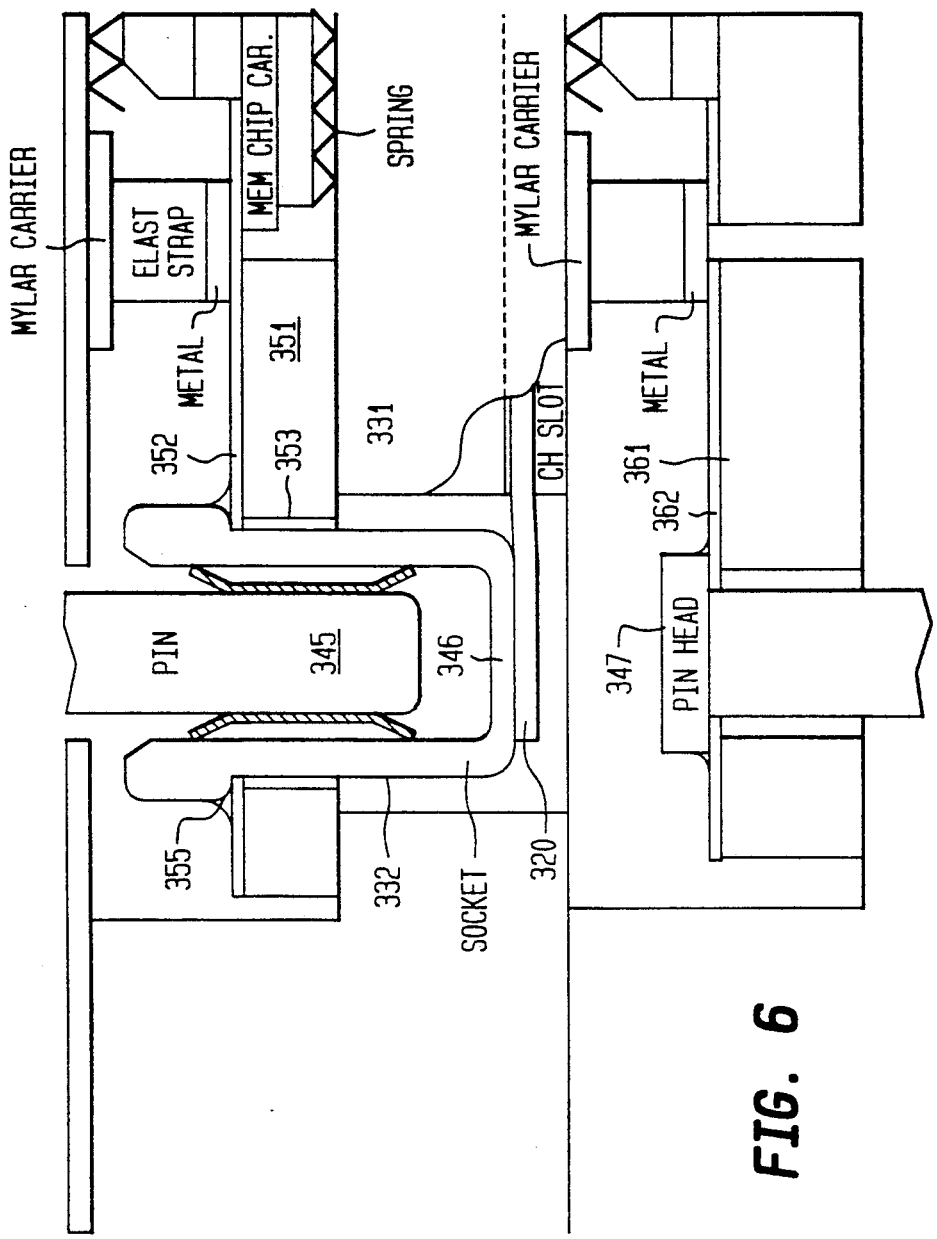
FIG. 6 shows respective edge-connection socket members for a three-dimensional laminate structure of chip carrier.

Connections among the D.C. wires, and from chip carrier leads through edge connectors, which extend through the support plate channels, such D.C. wire 320 in channel 325 shown in FIG. 5, for a three-dimensional laminate structure of chip carrier tiers, may be provided by respective edge-connection socket members, as shown in FIG. 6. The support plate of a respective chip carrier has an aperture 331 in which is retained a socket 332 mounted with a connector board adjacent to a perimeter region of the array of chip carriers. The socket 332, which is electrically and mechanically affixed to a conductive layer 352 on mounting board 351 by a solder region 355, may contain an interiorly mounted spring element which snugly engages the shank portion 345 of a pin 341, as shown. A bottom portion 346 of the socket is welded to the D.C. wire 320. The pin 341 has a head portion 347 which is bonded to a conductive layer 362 atop the connector board 361 of the next higher tier. When the two (vertically) adjacent tiers are stacked atop one another, the respective pin and socket elements are coupled together to provide electrical continuity among the D.C. wires and signal clock lines that extend through the channels in the support plates.

Figure 7:
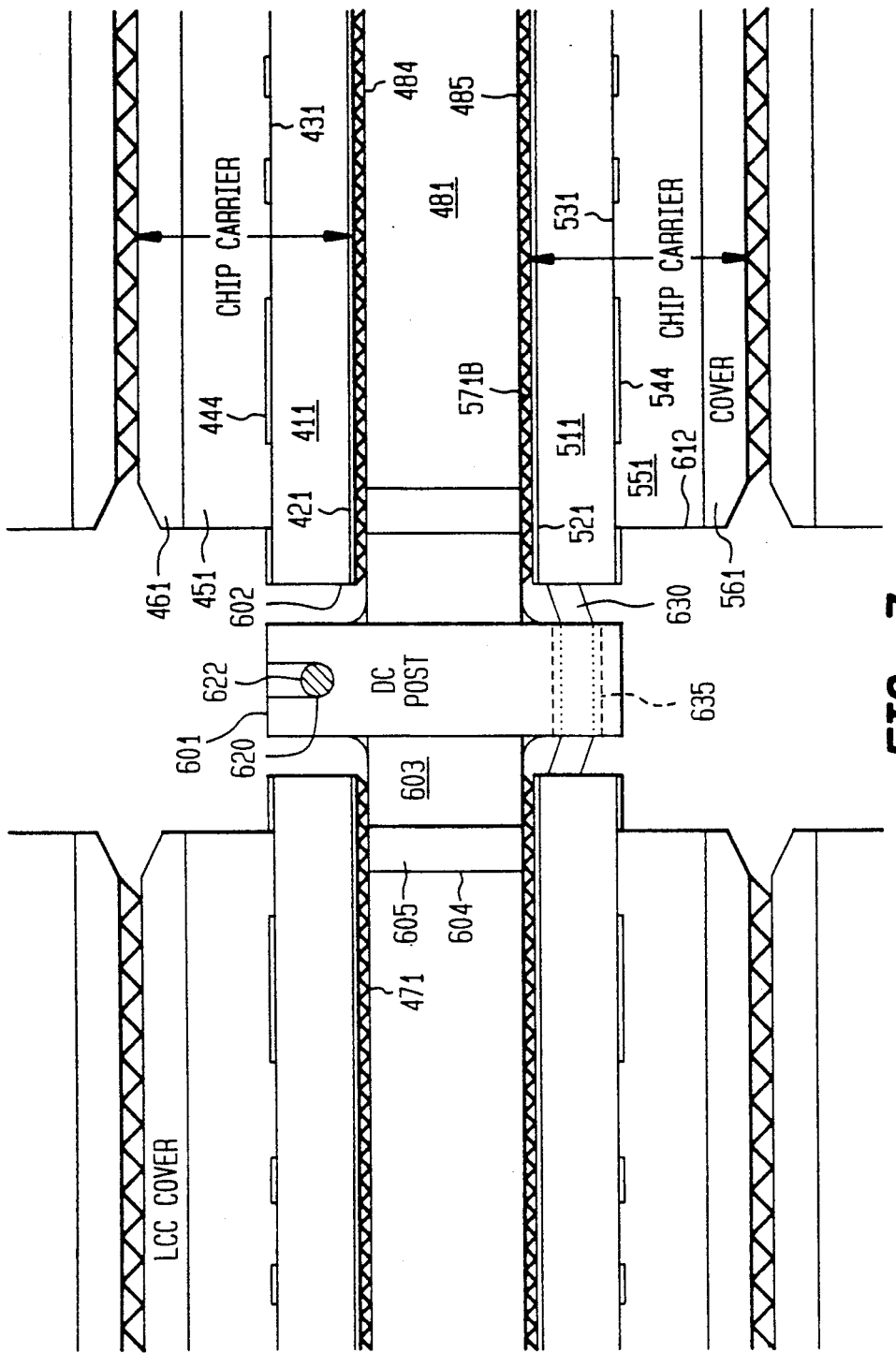
FIG. 7 shows an embodiment of the invention in which a feed through type pin/capacitor element is used to transmit D.C. and signals between back-to-back IC packages attached to a common support board.

FIG. 7 shows a further embodiment of the invention in which the pin/capacitor element is formed of a D.C. post 601 supported within and capacitively coupled with support plate 481 on opposite sides of which respective chip carriers may be mounted. The chip carriers are shown as ceramic plates 411 and 511 the bottom surfaces of which are provided with conductive coatings 421 and 521 which engage respective spring finger members 471 and 571 disposed on the opposite surfaces 484 and 485 of support plate 481. Through respective apertures 602 and 612 in ceramic plates 411 and 511 and a cylindrical aperture 604 in support plate 481, D.C. post 601 is supported by a surrounding ceramic or glass dielectric layer 603 and conductive ferrule 605, as shown. Channel regions may be provided by gaps between chip carrier packages, so that D.C. wires 620 and 630 may extend therethrough and engage apertures 622 and 635, respectively in post 601, as shown. Insulated wires may then be glued to the support plate before final assembly.

Signal conductors 444 and 544 (corresponding to conductors 44 and regions 45 in the embodiment shown in FIG. 1) are disposed on the top surfaces 431 and 531 of chip carrier ceramic plates 411 and 511. Respective covers 461 and 561 are mounted on wall layers 451 and 551, so as to complete a back-to-back or mirror-mounting of chip carrier bases on opposite sides of support plate 481. In this embodiment, rather than attach the carrier bases to the support plate 481 by way of the cylindrical stem and retaining members of the embodiment shown in FIG. 1, described above, edge-located fastener elements may be employed. These connector elements, not shown in FIG. 7, pass through cut out regions along the sides or edges of the chip carriers whereat the elastomeric connectors are provided. Such mechanical connectors provide a slight reduction in the signal line capacity along the edges of the stripes, but permit back-to-back mounting of multiple chip carriers to a common support plate, as shown. Such connectors may also be employed in the configuration described above with respect to FIG. 1, wherein a three-dimensional stack or tier of chip carriers is depicted. In such a modified embodiment, again the stem and retainer ring connectors are replaced by edge connectors. Still, the chip carrier basis ar disposed in a substantial abutting relationship providing a compact nesting of an array of multiple chip carriers.

Figure 8:
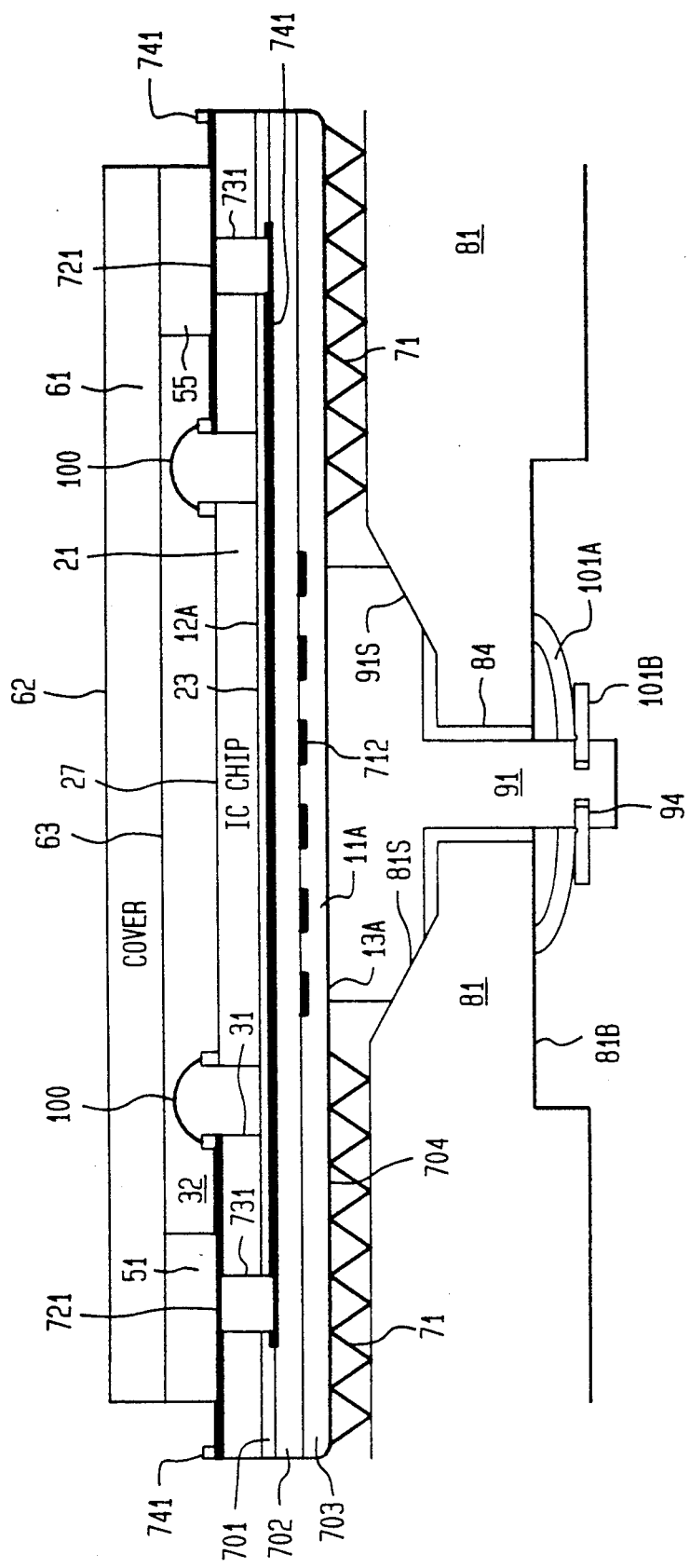
FIG. 8 shows a diagrammatic side view of a modified version of the embodiment of the chip carrier packaging scheme shown in FIG. 1.

Referring now to FIG. 8 there is illustrated a modified configuration of the embodiment described above with reference to FIG. 1 in which the support plate member is comprised of a metallized multilayer ceramic structure. More particularly, in place of the use of a solid metal plate, a support member 11A is comprised of a laminate structure of a pair of dielectric layers 701, 702 disposed atop a ceramic layer 703. The bottom surface of ceramic layer 703 has a conductive (grounding) layer 704 which forms the bottom surface 13A of the laminate structure and is conductively coupled to metallic support member 81 through spring member 71 and through base stem 91. The top surface of dielectric layer 701 forms surface 12A of the structure on which the IC chip 21 is die bond attached.

Between dielectric layer 701 and dielectric layer 702 a first set of conductor highways 711 extends in a first direction (left to right, as viewed in FIG. 8), while between second dielectric layer 702 and ceramic layer 703 a second set of conductor highways 712 extends in a direction orthogonal to the first set (into the drawing). Surface connections to the conductor highways of the respective sets are effected by conductor vias which extend through the dielectric layers to conductor layers 41 atop insulator layer 31. For this purpose, considering the set of conductor highways 711 as an example conductive feedthroughs 721 are formed in vias 731 which extend vertically through dielectric layer 701 and insulator layer 31 so as to form a vertical bridge between conductor layers 41 and highways 711. (Similar conductive vias, not shown, are provided for the second set of conductor highways 712).

FIG. 8 also illustrates the use of direct wire bonds 741 in place of elastomeric connectors for conductively bridging adjacent chip carriers. In addition, a snap ring attachment is depicted as including a snap ring 101A one end of which is captured in annular groove 94 of stem 91, while the other end is urged against the bottom surface 81B of support member 81 as a result of contact of abutting inclined heat transferring surfaces 81S and 91S of support member 81 and a (copper-tungsten) stem 91, respectively. Stem 91 is braze bonded to the metallized layer 704 on ceramic layer 703.

Although the above described embodiments relate to the packaging of a single integrated circuit memory chip within a chip carrier package, it is also possible to apply the present invention to chip carrier packages which house more than one integrated circuit component. In this event, of course, the reworkability is decreased since an individual package is basically a throwaway unit. However, the basic packaging density advantages of the present invention are retained.

As will be appreciated form the foregoing description, the present invention provides a packaging structure through which a plurality of microwave or high speed digital integrated circuits may be mounted in a compactly nested, cavity-up configuration, so as to permit access to the modules for reworkability, but without the use of a separate printed circuit board for support and interconnect among the modules, so that substantially enhanced packing density is afforded. As a result of this ability to compactly nest the chip carrier supporting mounting bases, the conductors of the carriers can be interconnected by direct wire bonding or an elastomeric connector, thereby obviating the need of a separate printed circuit board for support and interconnection of the chip carriers. In addition, the mechanical arrangement of the interconnecting elastomeric connectors and the ability to 'snap' each mounting base into and out of the apertures of the underlying support facilitates selective reworking of a multichip system, and thereby constitutes a significant reduction in cost of a large capacity memory.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. An arrangement for packaging a plurality of circuit modules comprising:

a thermally and electrically conductive support member having a plurality of attachment locations through which a plurality of said circuit modules may be retained in electrical and thermal communication with said support member;

each circuit module comprising a first surface upon a first portion of which is disposed an integrated circuit chip, and a plurality of electrical connection regions distributed along second, edge portions of said first surface of said module, and an arrangement of electrical interconnection links interconnecting electrical connection locations of said chip and said electrical connection regions, and means for attaching a second surface of said module, spaced apart from said first surface thereof, to a respective attachment location of said support member, such that said second surface of said module is in electrical and thermal communication with said support member; and wherein a plurality of said modules are attached to respective attachment locations of said support member, so as to be disposed adjacent to one another with the electrical connection regions thereof being aligned with one another in edge-to-edge relationship; and electrical interconnect links, unsupported by said support member and being spaced apart from said support member by said circuit module therebetween, but being supported by and joining electrical connection regions of adjacent modules that are aligned with one another in said edge-to-edge relationship.

2. An arrangement according to claim 1, wherein said attaching means comprises means for releasably attaching a module to a respective attachment location of said support member.

3. An arrangement according to claim 2, wherein a respective attachment location of said support member comprises an aperture therethrough, and said releasably attaching means includes a stem element extending from a module and sized to fit within an aperture in said support member and means, coupled with said stem element, for enabling said stem element to be releasably captured and retained within said aperture.

4. An arrangement according to claim 3, wherein said releasably attaching means comprises a snap ring retained within said aperture and said stem element has an annular groove therein which is sized to engage and be held by said snap ring when said stem element is inserted into said aperture.

5. An arrangement according to claim 3, further comprising a conductive spring member interposed between a module and said support member.

6. An arrangement according to claim 1, wherein a module comprises a flat plate member upon a first surface of which a chip is mounted in a face-up configuration, with chip bonding pad-to-interconnect leads being connected between bonding pads on a top of said chip and electrical interconnect links of said module which extend to electrical connection regions at said second, edge portions of said first surface of said module.

7. An arrangement according to claim 6, wherein a module further comprises a wall portion spaced apart from the edges of said module and surrounding said first portion of said first surface thereof upon which said chip is mounted, so as to define a cavity within which said chip is disposed, and such that the electrical connection regions of said module extend beyond said wall portion, and a cover member overlying said wall portion, so that said cavity is bounded by said cover member, said wall portion and the surface portion of said module upon which said chip is mounted.

8. An arrangement according to claim 1, wherein said support member has a plurality of channels therethrough extending in directions substantially in parallel with said first surface portion, and a plurality of apertures therethrough intersecting said channels, said apertures containing conductor elements conductively linked with conductive links disposed in said channels and being capacitively coupled with said support member.

9. An arrangement according to claim 8, wherein the plurality of apertures are arranged so as to be aligned with mutually adjacent portion of modules attached to said support member, and wherein a respective mutually adjacent portion of a module is shaped so as to be spaced apart from a conductor element extending through a respective one of said apertures thereat.

10. An arrangement according to claim 1, wherein said support member has a plurality of channels therethrough extending in directions substantially in parallel with said first surface portion, and a plurality of depression regions therein intersecting said channels and containing capacitor elements coupled between said support member and conductive links disposed in said channels.

11. An arrangement for packaging a plurality of circuit modules comprising:
a plurality of thermally and electrically conductive support members each of which has a plurality of attachment locations through which a plurality of said circuit modules may be retained in electrical and thermal communication with said support member;
each circuit module comprising a first surface upon a first portion of which is disposed an integrated circuit chip, and a plurality of electrical connection regions distributed along second, edge portions of said first surface of said module, and an arrangement of electrical interconnection links interconnecting electrical connection locations of said chip and said electrical connection regions, and means for attaching a second surface of said module, spaced apart from said first surface thereof, to a respective attachment location of said support member, such that said second surface of said module is in electrical and thermal communication with said support member; and wherein
a plurality of said modules are attached to respective attachment locations of said support members, so as to be disposed adjacent to one another with the electrical connection regions thereof being aligned with one another in edge-to-edge relationship; and
electrical interconnect links, unsupported by said support member and being spaced apart from said support member by said circuit module therebetween, but being supported by and joining electrical connection regions of adjacent modules that are aligned with one another in said edge-to-edge relationship; and wherein
said plurality of support members are mounted together in a stacked configuration, so as to form a three-dimensional arrangement of said circuit modules.

12. An arrangement according to claim 11, wherein a respective attaching means comprises means for releasably attaching a module to a respective attachment location of its support member.

13. An arrangement according to claim 12, wherein a respective attachment location of a support member comprises an aperture therethrough, and said releasably attaching means includes a stem element extending from a module and sized to fit within an aperture in said support member and means, coupled with said stem element, for enabling said stem element to be releasably captured and retained within said aperture.

14. An arrangement according to claim 13, wherein said releasably attaching means comprises a snap ring retained within said aperture and said stem element has an annular groove therein which is sized to engage and be held by said snap ring when said stem element is inserted into said aperture.

15. An arrangement according to claim 13, further comprising a conductive spring member interposed between a module and said support member.

16. An arrangement according to claim 11, wherein a module comprises a flat plate member upon a first surface of which a chip is mounted in a face-up configuration, with chip bonding pad-to-interconnect leads being connected between bonding pads on a top face of said chip and electrical interconnect links of said module which extend to electrical connection regions at said second, edge portions of said first surface of said module.

17. An arrangement according to claim 16, wherein a module further comprises a wall portion spaced apart from the edges of said module and surrounding said first portion of said first surface thereof upon which said chip is mounted, so as to define a cavity within which said chip is disposed, and such that the electrical connecting regions of said module extend beyond said wall portion, and a cover member overlying said wall portion, so that said cavity is bounded by said cover member, said wall portion and the surface portion of said module upon which said chip is mounted.

18. An arrangement according to claim 11, wherein said support member has a plurality of channels therethrough extending in directions substantially in parallel with said first surface portion, and a plurality of apertures therethrough intersecting said channels, said apertures containing conductor elements conductively linked with conductive links disposed in said channels and being capacitively coupled with said support member.

19. An arrangement according to claim 11, further comprising conductive spring members interposed between successive modules and support members of said stacked configuration.

20. An arrangement according to claim 11, wherein said support member has a plurality of channels therethrough extending in directions substantially in parallel with said first surface portion, and a plurality of depression regions therein intersecting said channels and containing capacitor elements coupled between said support member sand conductive links disposed in said channels.

21. A structure for packaging and electrically interconnecting a plurality of integrated circuit-containing modules comprising:
a thermally and electrically conductive support member having a two-dimensional arrangement of module attachment locations through which plural ones of said integrated circuit-containing modules are selectively and releasably attached to said support member;
each integrated circuit-containing module comprising a first surface upon a first portion of which is disposed an integrated circuit chip, and a plurality of electrical connection regions distributed along second, edge portions of said first surface of said module, and an arrangement of electrical interconnection links interconnecting electrical connection locations of said chip and said electrical connection regions, and means for attaching a second surface of said module, spaced apart from said first surface thereof, to a respective attachment location of said support member, such that said second surface of said module is in electrical and thermal communication with said support member; and wherein
a plurality of said modules are attached to respective attachment locations of said support member, so as to be disposed adjacent to one another an form a two-dimensional arrangement of modules on said support member with electrical connection regions of adjacent modules being aligned with one another in edge-to-edge relationship; and
electrical interconnect links, unsupported by said support member and being spaced apart from said support member by said circuit module therebetween, but being supported by and joining electrical connection regions of adjacent modules that are aligned with one another in said edge-to-edge relationship.

22. An arrangement according to claim 21, wherein said integrated circuit modules contain integrated circuit memory chips respective like memory location interface signal lines for which are electrically connected to electrical connection regions of modules that are mutually aligned with one another in said edge-to-edge relationship.

23. An arrangement according to claim 21, wherein said plurality of modules attached to said support member in said two-dimensional arrangement contain integrated circuit chips of the same configuration and wherein respective signal interface lines of chips of adjacent modules are electrically connected to electrical connection regions of their respective modules that are mutually aligned with one another in said edge-to-edge relationship.

24. An arrangement according to claim 23, wherein a respective module further includes electrical connection links interconnecting electrical connection regions distributed along different sides of said module.

25. An arrangement according to claim 23, wherein a respective module is substantially rectangularly shaped and includes electrical connection links interconnecting electrical connection regions distributed along spaced apart parallel sides of said module.

26. An arrangement according to claim 25, wherein said integrated circuit chips comprise integrated circuit memory chips having data and address lines and wherein a respective module includes first electrical connection links extending in a first direction between first parallel sides thereof to which data lines of a memory chip disposed on said first surface portion of said module are connected, said first electrical connection links being connected to electrical connection regions distributed along said first parallel sides of said module, and second electrical connection links extending on a second direction between second parallel sides thereof to which address lines of said memory chip are connected, said second electrical connection links being connected to electrical connection regions distributed along said second parallel sides of said module.

27. An arrangement for packaging a plurality of circuit modules comprising:
a thermally and electrically conductive support member having a plurality of attachment locations through which a plurality of said circuit modules may be retained in electrical and thermal communication with said support member;
each circuit module comprising a surface portion upon which is disposed an integrated circuit chip and an arrangement of electrical interconnect links interconnected with electrical connection locations of said chip and electrical connection regions distributed along edge portion of said each module, and including conductor highways by passing said chip and interconnecting electrical connection regions distributed along edge portions of said each module, and means for attaching said each module to a respective attachment location of said support member; and
a plurality of said circuit modules are attached to respective attachment locations of said support member, so as to be disposed adjacent to one another with the electrical connection regions thereof being aligned with one another in edge-to-edge relationship; and
means for interconnecting electrical connection regions of adjacent modules.

28. An arrangement according to claim 27, wherein said module comprises a multilayer insulator structure having sets of said conductor highways extending therethrough.

29. A multichip integrated circuit memory comprising:
a two-dimensional array of chip carriers, arranged in side-by-side relationship, each chip carrier containing at least one chip and having a plurality of electrical connection regions distributed along respective sides thereof to which electrical connection locations on said at least one chip are electrically coupled;
first means for structurally supporting said chip carriers in said two-dimensional array; and second means for providing electrical connections between electrical connection regions along the sides of adjacent chip carrier independent of said first means, and wherein said first means comprises a support member has a two-dimensional array of chip carrier support locations thereon, and means for releasably attaching each chip carrier to a respective support location independently of each other.

30. A multichip integrated circuit memory comprising:

a two-dimensional array of chip carriers, arranged in side-by-side relationship, each chip carrier containing at least one chip and having a plurality of electrical connection regions distributed along respective sides thereof to which electrical connection locations on said at least one chip are electrically coupled;

first means for structurally supporting said chip carrier in said two-dimensional array; and second means for providing electrical connections between electrical connection regions along the sides of adjacent chip carriers independent of said first means, and wherein 'said second means comprises electrical connector elements bridging the electrical connection regions of the sides of adjacent chip carriers.

* * * * *